(12) United States Patent
Gao

(10) Patent No.: US 12,058,837 B2
(45) Date of Patent: Aug. 6, 2024

(54) ENCLOSURE FOR ELECTRONIC DEVICE WITH LIQUID COOLING

(71) Applicant: BAIDU USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 203 days.

(21) Appl. No.: 17/484,800

(22) Filed: Sep. 24, 2021

(65) Prior Publication Data

US 2023/0115186 A1    Apr. 13, 2023

(51) Int. Cl.
*H05K 7/20* (2006.01)

(52) U.S. Cl.
CPC ..... *H05K 7/20254* (2013.01); *H05K 7/20272* (2013.01); *H05K 7/20781* (2013.01)

(58) Field of Classification Search
None
See application file for complete search history.

(56) References Cited

U.S. PATENT DOCUMENTS

| | | | | |
|---|---|---|---|---|
| 10,362,704 | B2 * | 7/2019 | Hirano | H05K 7/1452 |
| 10,813,246 | B2 * | 10/2020 | Lin | H05K 7/20154 |
| 10,905,031 | B1 * | 1/2021 | Gao | G06F 1/184 |
| 11,019,752 | B2 * | 5/2021 | Gao | H05K 7/20272 |
| 11,129,305 | B2 * | 9/2021 | Raeth | H05K 7/20409 |
| 11,547,022 | B2 * | 1/2023 | Gao | H05K 7/20272 |
| 11,606,885 | B2 * | 3/2023 | Gao | H05K 7/20781 |
| 2009/0161312 | A1 * | 6/2009 | Spearing | H05K 7/20781 361/679.53 |
| 2021/0368656 | A1 * | 11/2021 | Heydari | H05K 7/20836 |
| 2022/0210949 | A1 * | 6/2022 | Edmunds | H05K 7/20272 |
| 2022/0361375 | A1 * | 11/2022 | Heydari | H05K 7/20281 |
| 2023/0085165 | A1 * | 3/2023 | Gao | H05K 7/20272 |
| 2023/0089909 | A1 * | 3/2023 | Gao | H05K 7/20272 361/679.53 |

* cited by examiner

Primary Examiner — Courtney L Smith
(74) Attorney, Agent, or Firm — WOMBLE BOND DICKINSON (US) LLP

(57) ABSTRACT

In one embodiment, an electronic device cooling package includes an enclosure to house an electronics package, the enclosure including at least one panel with an integrated conducting plate exposed to both an inner surface of the at least one panel and an outer surface of the at least one panel. The electronic device cooling package further includes a mounting mechanism attached to the enclosure to detachably couple a cooling device to the outer surface of the at least one panel of the enclosure. Different electronics packaged within the cooling package includes different co-design of the cooling package and cooling devices.

18 Claims, 9 Drawing Sheets

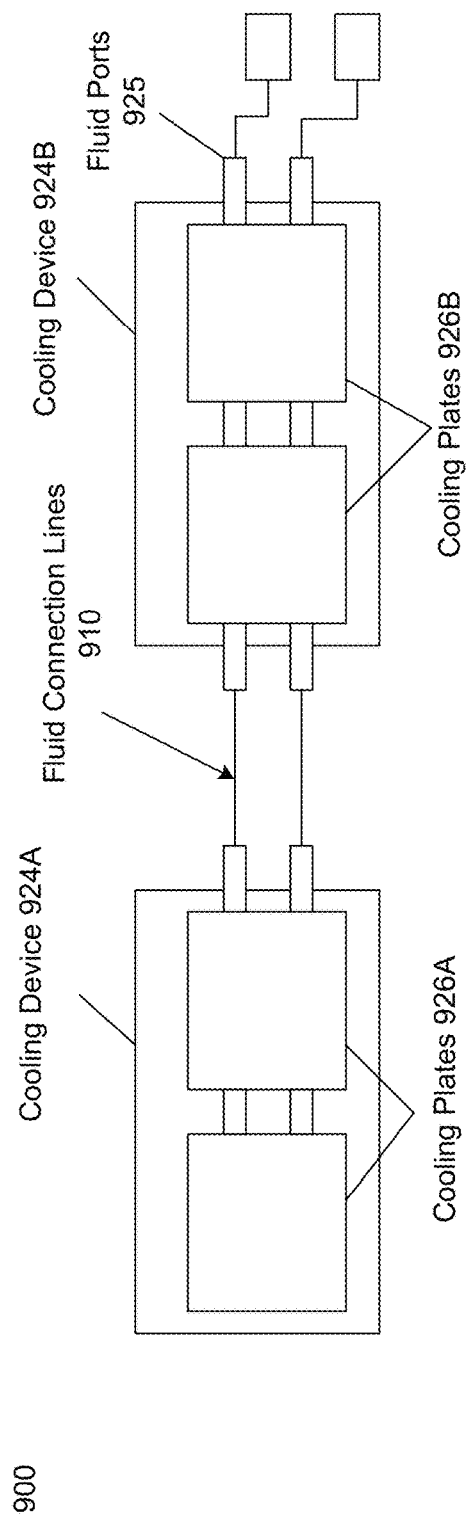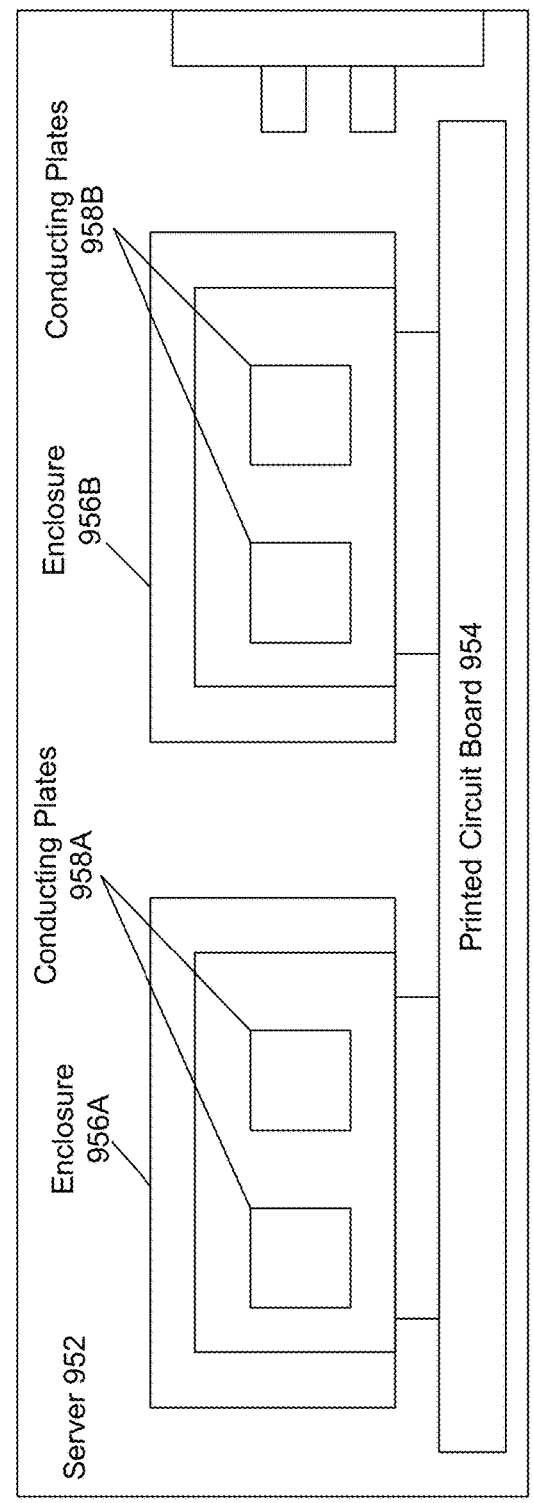
FIG. 9A
FIG. 9B

ENCLOSURE FOR ELECTRONIC DEVICE WITH LIQUID COOLING

FIELD OF THE DISCLOSURE

Embodiments of the present invention relate generally to electronics cooling. More particularly, embodiments of the invention relate to cooling hardware of a server design with high reliability.

BACKGROUND

Thermal management of a data center that includes several active electronic racks is critical to ensure proper performance of servers and other IT equipment operating in the racks. Without proper thermal management the thermal environment within the racks may exceed operational thresholds, resulting in operational consequences (e.g., servers failing, etc.). One way to manage the thermal environment is the use of cooling air to cool the IT equipment. A majority of existing data centers are air cooled. Recently, data centers have been deploying more high-power density electronic racks, where more high density chips are packaged closer together to provide more processing power. Cooling these high-density racks by maintaining a proper thermal environment may be a challenge with existing cooling systems, especially within the constant increasing power density of the racks.

Liquid cooling systems may be used to cool high-density racks due to the increased cooling capacity of liquid cooling. Existing solutions for liquid cooling systems may require fluid connections and hoses to distribute cooling liquid to cooling devices of the electronic rack. Such fluid connections and hoses therefore coexist with electronics on the electronic rack. The connections and hoses of the liquid cooling system may be prone to leaks which may cause damage to the electronics of the rack.

BRIEF DESCRIPTION OF THE DRAWINGS

Embodiments of the invention are illustrated by way of example and not limitation in the figures of the accompanying drawings in which like references indicate similar elements.

FIG. 9A is a side view of a server cooling system with a series of cooling devices to be incorporated on the electronics enclosure packages of a server chassis for liquid cooling, according to come embodiments.

FIG. 9B is a side view of a server chassis with electronics enclosures for electronic devices to be mounted with cooling devices, according to some embodiment.

DETAILED DESCRIPTION

Figure 1:
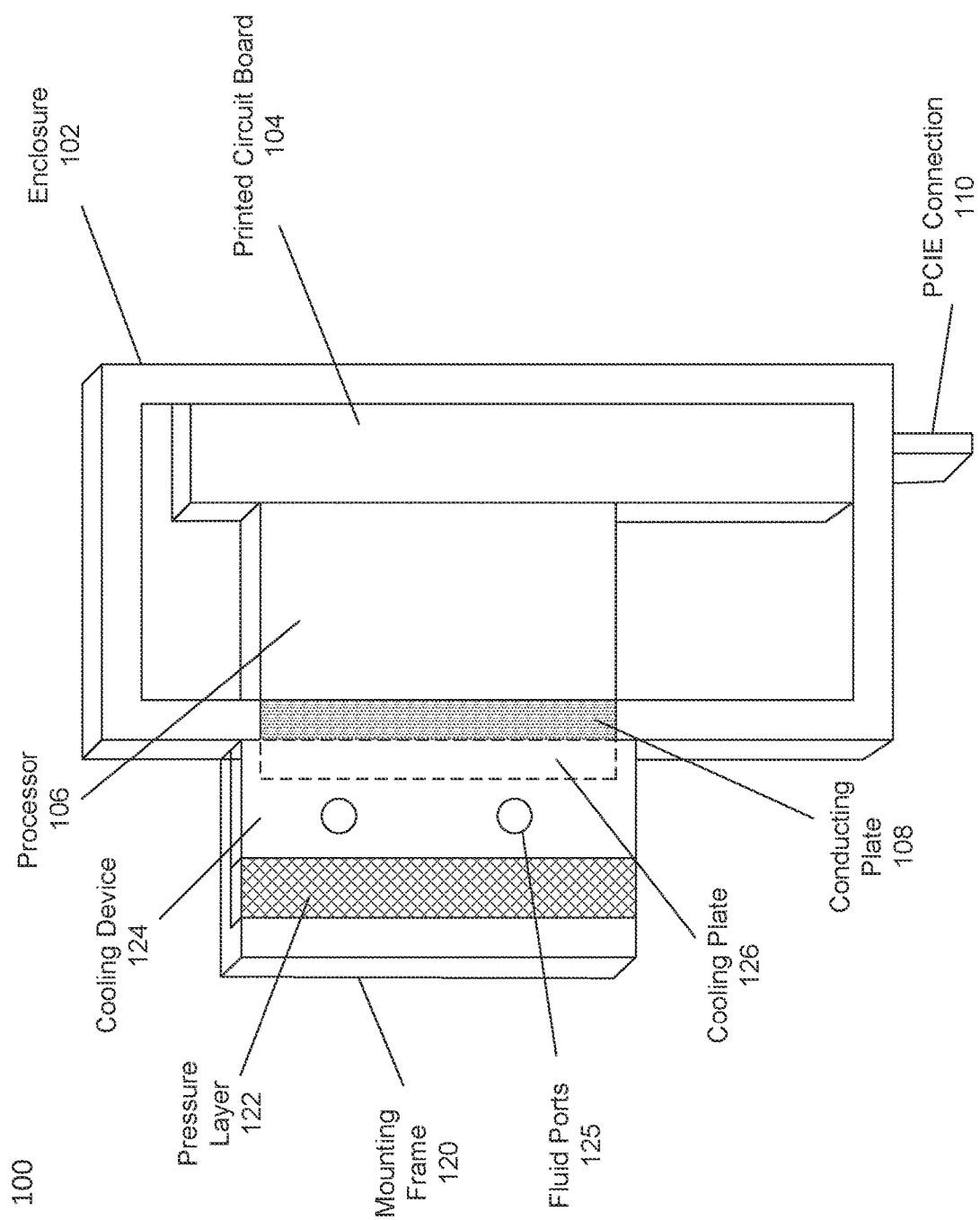
FIG. 1 is a rear view an electronics enclosure package design, according to some embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure provide for a contained electronics package for enclosing an electronics device (e.g., peripheral component interconnect express (PCIE) device, main chip, etc.) with a conducting surface through which liquid cooling can be performed. The contained electronics package can include an enclosure in which an electronics device is enclosed. For example, the enclosure may include four or more panels enclosing the electronics device. One of the panels of the enclosure may include an integrated conducting plate through which heat may be extracted from the electronic device. The same panel of the enclosure that includes the conducting plate may also include a mechanism to attach a cooling device on the surface of the panel. A cooling area, such as a cooling plate, of the cooling device may be aligned with the conducting plate to extract the heat from the electronic device through the conducting plate of the panel. Thus, the cooling device may provide cooling for the contained electronics package and the enclosure can segregate the cooling device from the electronics.

Embodiments of the present disclosure may therefore provide for high reliability liquid cooling by segregating electronic devices from potential fluid leaks of the cooling plates or cooling devices. Furthermore, the present disclosure provides ease of manufacture and assembly while also accommodating different device form factors and server chassis configurations.

According to one embodiment, an electronic device cooling package includes an enclosure to house an electronics package, the enclosure including at least one panel with an integrated conducting plate exposed to both an inner surface of the at least one panel and an outer surface of the at least one panel. The electronic device cooling package further includes a mounting mechanism attached to the enclosure to detachably couple a cooling device to the outer surface of the at least one panel of the enclosure.

In some embodiments, the cooling device includes one or more cooling plates corresponding to a location of one or more electronic devices of the electronics package. In some embodiments, the integrated conducting plate is in thermal contact with the one or more electronic devices of the electronics package on the inner surface of the at least one panel and the integrated conducting plate is in thermal contact with the one or more cooling plates of the cooling device on the outer surface of the at least one panel. In some embodiments, the mounting mechanism includes a rigid mounting frame providing an opening between the rigid mounting frame and the enclosure to insert the cooling device. In one embodiment, the mounting mechanism also includes a pressure layer disposed within the opening between the rigid mounting frame and the enclosure to provide mounting pressure on the cooling device to fix the cooling device in place and to provide proper thermal contact between the integrated conducting plate and the one or more cooling plates of the cooling device. Proper thermal contact may be achieved with a mounting pressure within a range defined by a chip vendor. For example, the proper range of mounting pressure may large enough to provide sufficient thermal conduction performance to cool the electronics but less than a pressure that would damage the electronics hardware. In some embodiments, the mounting frame is customized for different types of cooling devices. In an embodiment, an advanced mounting frame may vary the mounting pressure on the devices.

In some embodiments, the cooling device further includes one or more fully integrated internal fluid channels one or more fluid ports disposed on a back end of the cooling device to provide fluid connections outside of the opening provided by the rigid mounting frame. In one embodiment, the cooling device includes a first layer of cooling plates corresponding to locations of one or more electronic devices of the electronics package and an additional cooling plate spanning the first layer of cooling plates, wherein the additional cooling plate comprises cooling channels separate from the first layer of cooling plates.

FIG. 1 shows a rear view an electronics enclosure package design (or electronic device cooling package) 100, according to one embodiment. The design may include a printed circuit board (PCB) and the one or more processors of the PCB within an enclosure. In some embodiments, at least four sides of the package are fully enclosed. A cooling device can be attached to the enclosure via a mounting kit. A pressure layer of the mounting kit may provide for pressure against the cooling device to ensure sufficient contact and pressure of the cooling device to one or more conducting plates included in a panel of the enclosure. Thus, all fluid channels and ports are designed outside of the enclosure of the electronics. Therefore, the electronics are fully segregated from the cooling liquid and any potential leaks will not cause additional damage to the electronics. The fluid ports may face a rear of the enclosure package and may be integrated as part of the cooling device.

In one embodiment, referring to FIG. 1, the enclosure package design includes an enclosure 102 to house electronics such as a printed circuit board 104 and a processor 106 attached to the PCB 104. Although only one processor is depicted, any number of processors or other electronic chips may be included in the package. In one example, the PCB 104 and processor 106 are part of a PCIE device and may include PCIE connection 110 for the connecting the PCB 104 and the processor 106 to a server motherboard. In one example, the processor 106 may be an accelerator chip, such as graphics processing unit (GPU). The processor 106 may be a high power density device and is liquid cooled in the present design. In an embodiment, the entire printed circuit board 104 is designed with liquid cooling. This may require a proper thermal contact component implemented between the conducting plate and the entire printed circuit board. In such a design, the conducting plate 108 may cover a larger area, such as the entire area of the cooling device to better extract the heat from the entire board.

In some embodiments, the enclosure 102 includes at least four enclosed surfaces. One surface of the enclosure includes a conducting plate 108. The conducting plate 108 may be a thermally conductive material to allow heat to easily travel from the processor 106 to a cooling plate 126 of cooling device 124. A mounting frame 120 may be attached to the enclosure for mounting the cooling device 124 to the surface of the enclosure. A pressure layer 122 may be attached to the mounting frame 120 to provide pressure across the cooling device when the cooling device is inserted between the pressure layer 122 and the surface of the enclosure 102. The pressure provided by the pressure layer 122 may fix the cooling device 124 in place against the enclosure 102 and ensure thermal contact between the cooling plate 108 f the cooling device and the surface of the enclosure 102.

The cooling device 124 may include fluid ports 125 for connecting to an external coolant source. The cooling device 124 may further include internal fluid channels for circulating the received liquid coolant to and from the cooling plate 126. The cooling plate 126 may be a thermally conductive area within the cooling device 124 through which heat can be extracted to the liquid coolant. Thus, heat generated by operation of the processor 106 is extracted through the conducting plate 108 and the cooling plate 126 to the liquid coolant traveling through the cooling plate 126, which then carries away the heat as it is returned to the external coolant source. Therefore, the cooling device 124 can be used to cool the processor 106 and the processor 106 and printed circuit board 104 are protected, by the enclosure 102, from potential cooling liquid leaks of the cooling device 124.

Figure 2:
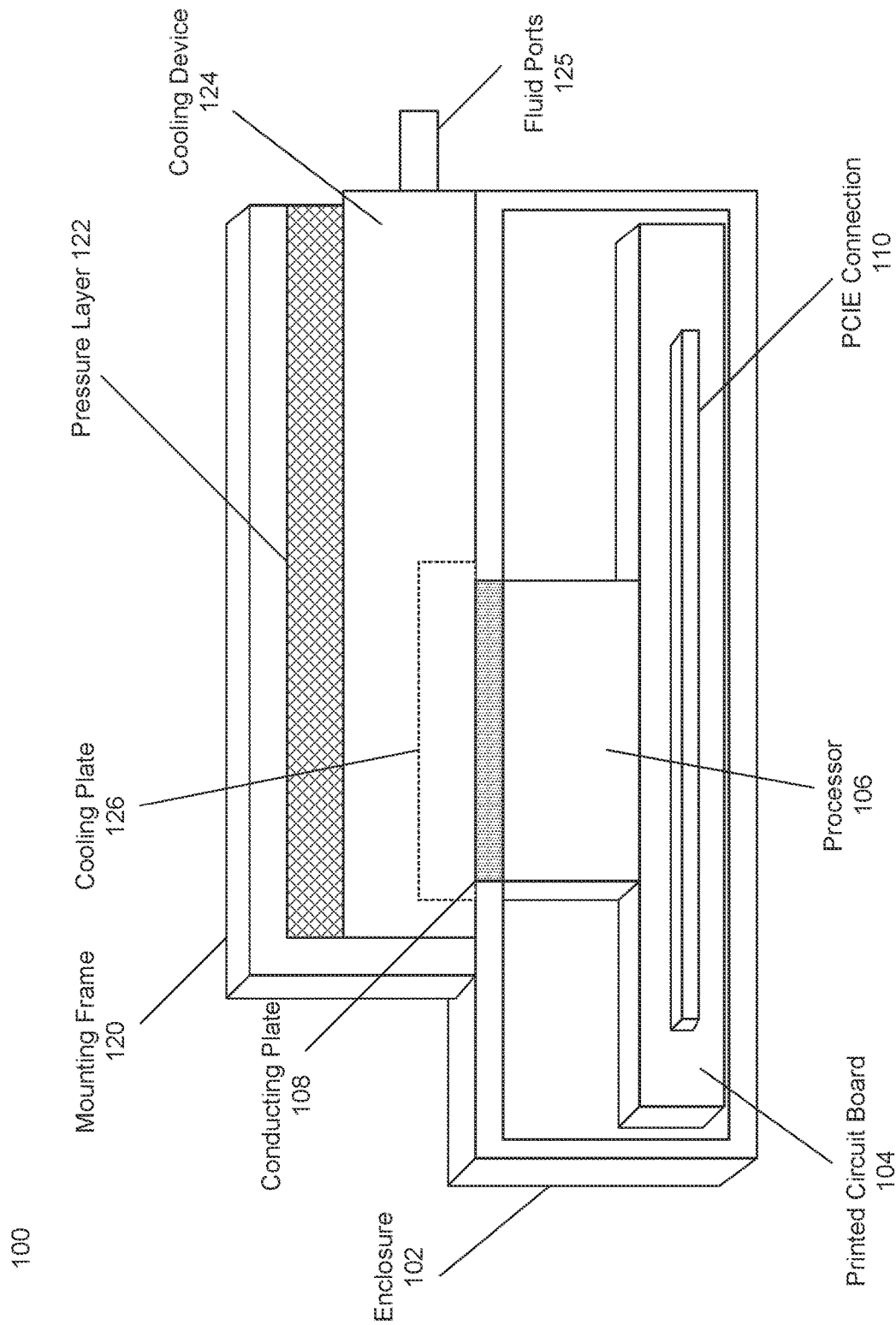
FIG. 2 is a bottom view of an electronics enclosure package, according to some embodiment.

FIG. 2 depicts the electronics enclosure package 100 of FIG. 1 from a bottom view. As depicted in FIG. 2, the PCB 104 and processor 106 is enclosed within the enclosure 102. The PCB 104 include a PCIE connection 110 for attaching the package, including the PCB 104, processor 106, and the enclosure 102 to a motherboard (e.g., of a server). As can be seen in FIG. 2, the conducting plate 108 is completely integrated into a surface of the enclosure. The conducting plate 108 allows for thermal transfer from the processor 106 within the enclosure 102 to the cooling plate 126 of the cooling device 124 outside of the enclosure. Thus, the electronics can be completely separated from the cooling device 124 and any potential liquid coolant leaks of the cooling device 124 by the enclosure 102.

In some embodiments, the mounting frame 120 is a rigid frame attached to a surface of the enclosure (e.g., the same surface as the conducting plate 108) providing a space or a gap between the surface of the enclosure and the upper portion of the mounting frame 120. The pressure layer 122 may be attached to the upper arm of the mounting frame. The pressure layer 122 may have a consistent thickness to provide for even pressure to the cooling device 124. The cooling device 124 may be mounted to the enclosure 102 by the pressure provided by the pressure layer 122. In some embodiments, the cooling device 124 is removable and replaceable.

In some embodiments, the cooling plate 126 and cooling device 124 are integrated as one unit. Cooling plate 126 can be understood as the cooling core area of the cooling device 124. In some embodiment, the cooling core area (e.g., cooling plate 126) is designed with micro fin structures. Internal fluid channels within the cooling device 124 are connected with the micro fin cooling area.

Figure 3:
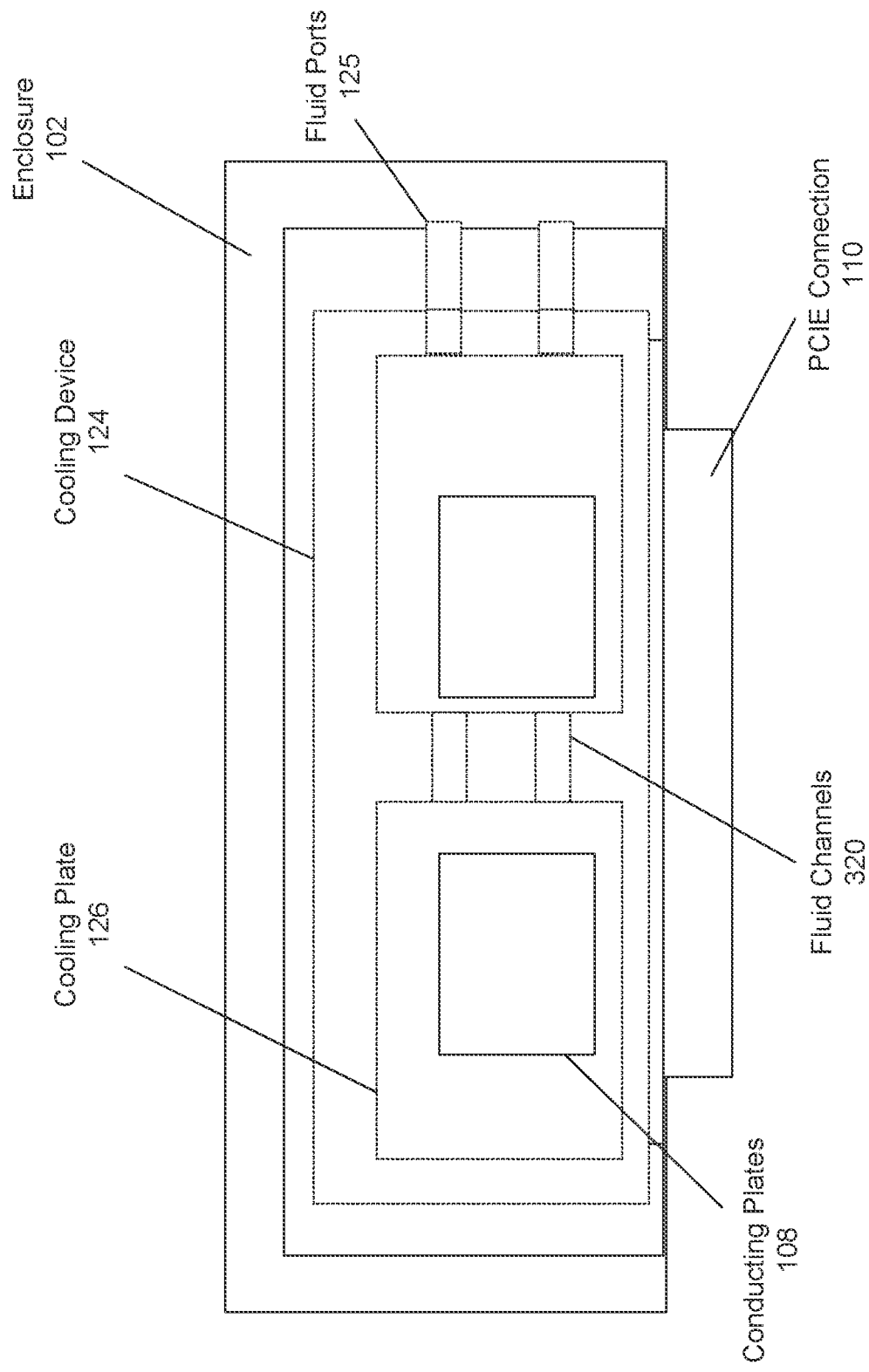
FIG. 3 is a side view an electronics enclosure package design, according to some embodiment.

FIG. 3 shows a side view the electronics enclosure package design 100, according to one embodiment. Similar to FIGS. 1 and 2, the electronics enclosure package design includes an enclosure 102 that may house an electronics package (e.g., a PCIE device). The electronics package may include PCIE connections 110 to connect the electronic devices to a motherboard via a PCIE bus/interface. As shown, one surface of the enclosure 102 may include one or more conducting plates 108. In some embodiments, a cooling device 124 may be attached to the surface of the enclosure 102 that includes the conducting plates 108. The cooling device 124 may include one or more cooling plates 126 that correspond to the locations of the conducting plates 108. Additionally, the conducting plates 108 and the cooling plates 126 may correspond to the locations of electronic devices (e.g., a processor, accelerator, etc.) included within the enclosure 102 to extract heat from the electronics devices. The cooling device 124 may include fluid ports 125 at the end of the cooling device 124 to receive a cooling liquid from an external source. The cooling device 124 may also include internal fluid channels 320 to direct the cooling liquid from the fluid ports 125 to the one or more cooling plates 126 and return the cooling liquid to the external source. In some embodiments, the cooling plate 126 and cooling device 124 can be fabricated as one unit with all the fluid channels 320 contained internally within the cooling device 124.

Figure 4:
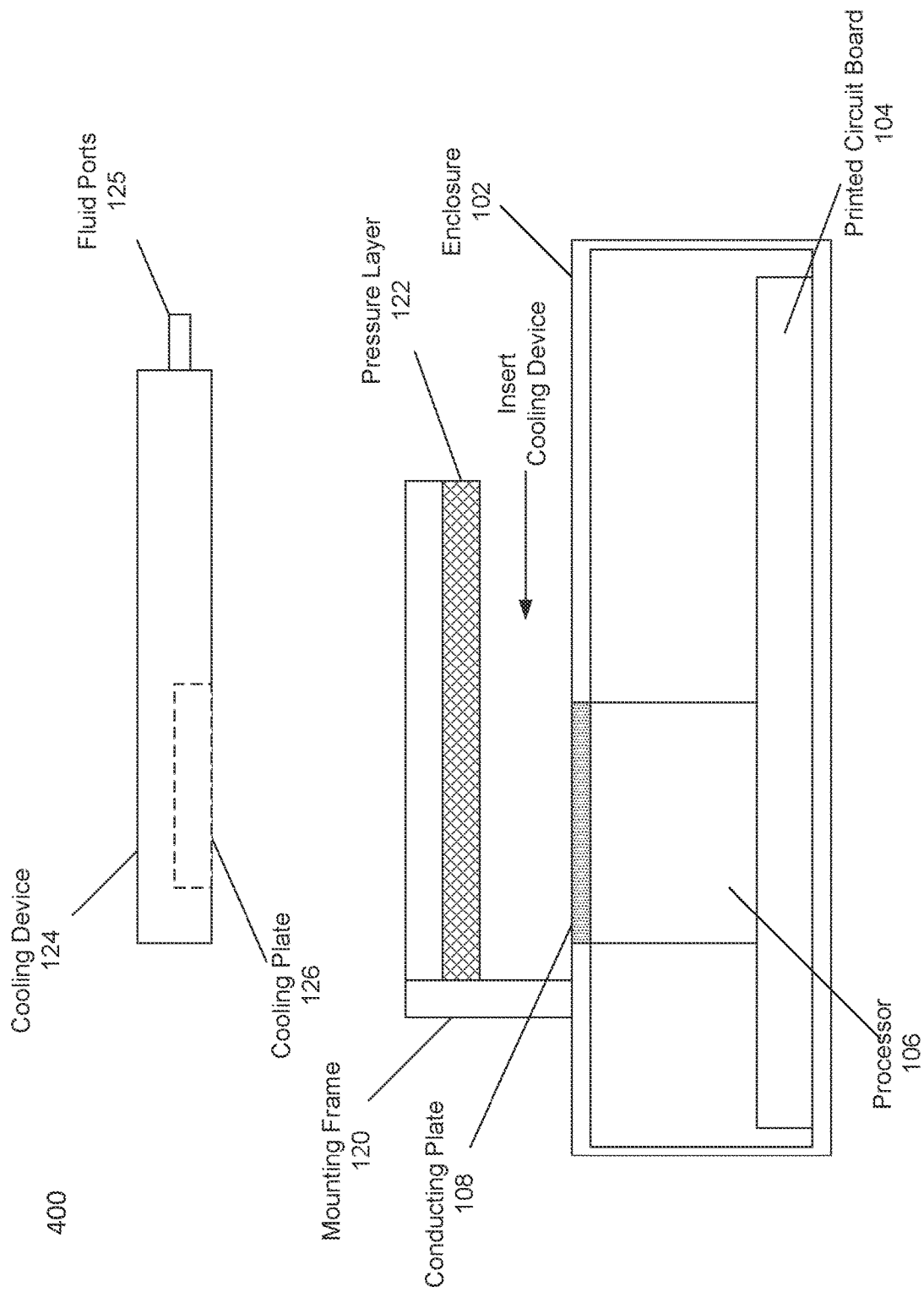
FIG. 4 is a side view of an electronics enclosure package design with a detachable cooling device, according to some embodiments.

FIG. 4 shows a side view of an electronics enclosure package design (or electronic device cooling package) 400 with a detachable cooling device, according to some embodiments. Electronics enclosure package design 400 can represent electronics enclosure package design 100 of FIG. 1.

In some embodiments, as depicted in FIG. 4, the mounting frame 120 may be attached directly to a surface of the enclosure 102 to provide a slot for inserting a cooling device. For example, the mounting frame 120 and the associated pressure layer 122 may provide for a slot in which the cooling device 124 may be inserted. When inserted the pressure layer 122 may provide even pressure across the surface of the cooling device to ensure thermal contact between the cooling plate 126 and the conducting plate 108. Therefore, the width of the cooling device 124 may be slightly larger than the slot in which the cooling device is inserted so that the pressure layer 122 may provide a force against the cooling device 124. For example, the pressure layer 122 may include springs or other elastic materials that provide a resistive elastic force when compressed. The pressure layer 122 may alternatively include any other mechanism that may provide a pressure against the cooling device 124, such as screws, hydraulics, etc. When assembled the fluid ports may be at an end of the cooling device 124 which can be accessed such that fluid lines may be attached to the fluid ports 125. The cooling plate 126 may thus receive cooling liquid from the fluid ports to extract heat from the processor 106 on the PCB 104 through the conducting plate 108.

Figure 5:
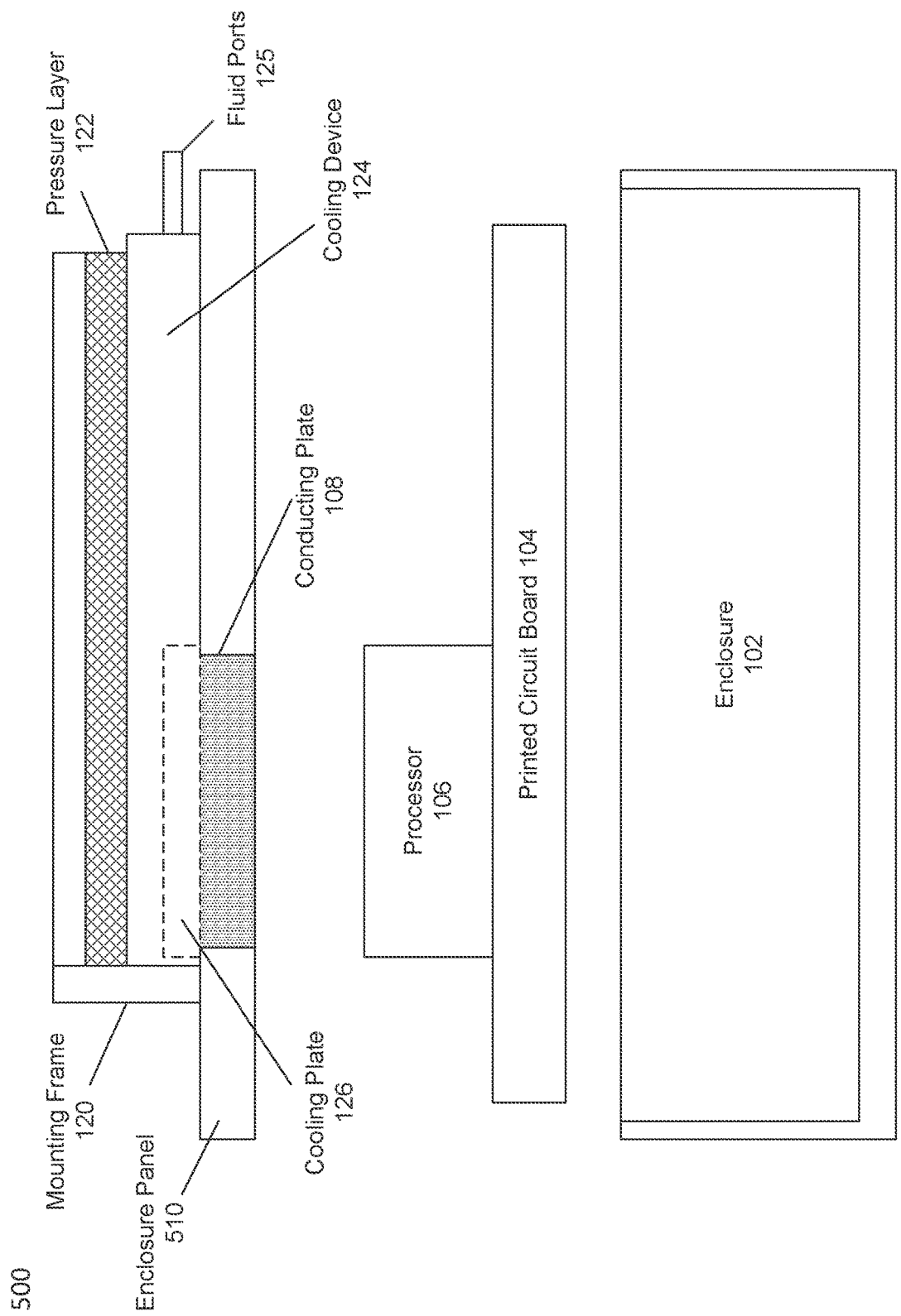
FIG. 5 shows an exploded view of components of an electronics enclosure package design with liquid cooling, according to some embodiments.

FIG. 5 shows an exploded view of components of an electronics enclosure package design (or electronic device cooling package) 500 with liquid cooling, according to some embodiments. Electronics enclosure package design 500 can represent electronics enclosure package design 100 of FIG. 1.

As depicted in FIG. 5, different components of the electronics enclosure package may be assembled separately and then incorporated together. For example, the PCB 104 and processor 106 may be assembled together (e.g., as a PCIE device, a processing chip, or other electronics chip). The enclosure 102 may be assembled to receive the PCB 104 and processor 106. The enclosure 102 may be designed according to the specifications of the processor 106/PCB 104 assembly (e.g., electronic device or chip). For example, the enclosure 102 may be designed to accommodate the width, length and height of the electronic device/chip.

In some embodiments, an enclosure panel 510 may include a conducting plate 108. The placement of the conducting plate 108 may depend on the specifications of the electronic device including the placement of the processor 106 on the PCB 104 such that the conducting plate is in contact with the processor 106 upon full assembly of the enclosure 102. The enclosure panel 510 may be assembled with the mounting frame 120 and pressure layer 122 to mount the cooling device 124 to the enclosure panel 510. As described above, the cooling device 124 can include fluid ports 125 to receive cooling liquid and a cooling plate 126 to extract heat from the processor 106 through the conducting plate 126. The location of the cooling plate 126 in the cooling device may depend on the location of the conducting plate 108 and the specifications of the processor 106 on the PCB 104. In some embodiments, the mounting frame 120 and/or the pressure layer 122 may be adjusted to accommodate different enclosures and different cooling devices. Additionally, the mounting frame 120 and/or pressure layer 122 may be adjustable to provide differing mounting pressures for different enclosures and cooling devices according to specifications of such. Furthermore, it should be noted that the depicted design of the mounting frame 120 is illustrative rather than limiting. The mounting frame 120 may include any frame design and may be attached to an enclosure in any known manner.

Figure 6:
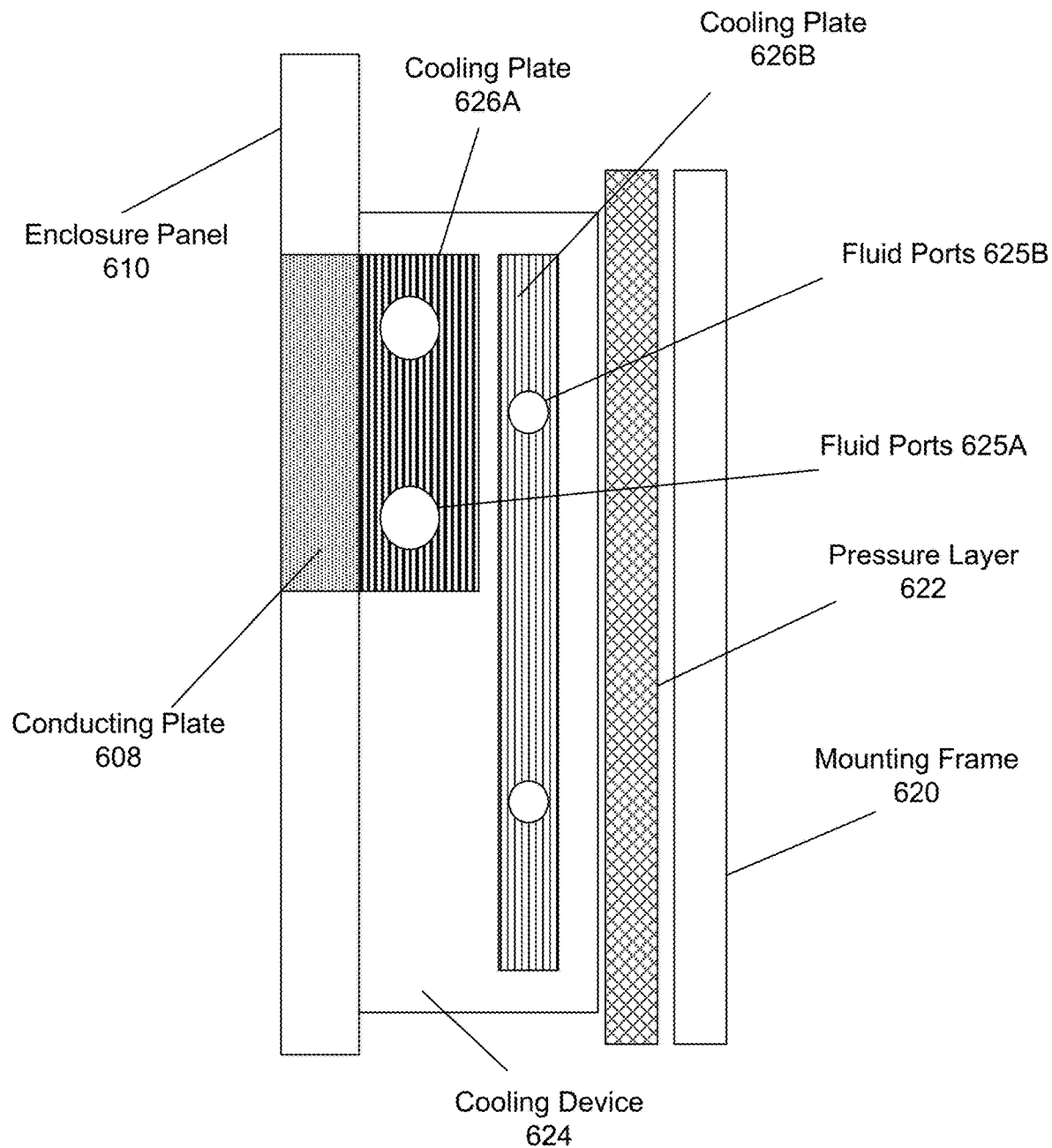
FIG. 6 shows a rear view of cooling device with separate cooling plates and cooling channels, according to some embodiments.

FIG. 6 shows a cooling device with separate cooling plates and cooling channels, according to some embodiments. The separate cooling channels of the different cooling plates can be designed for redundant operation. Additionally, the separate cooling channels may use different cooling fluids.

In some embodiments, as depicted in FIG. 6, a cooling device 624 can include a first cooling plate 626A with dedicated fluid ports 625A and fluid channels and a second cooling plate 626B with separate dedicated fluid ports 625B and fluid channels. The cooling device 624 may operate with both cooling plates 626A-B at the same time or with either cooling plate 626A or cooling plate 626B. For example, when cooling a very high power density electronic device that generates a large amount of heat, the cooling plate 626B may operate in addition to cooling plate 626A to provide additional cooling capacity that may be necessary to cool the electronic device. In another example, if cooling plate 626A fails, then cooling plate 626B may be used to cool the electronic device as a redundant unit (e.g., by extracting heat through conducting plate 608 of enclosure panel 610 and cooling plate 626A). Similar to FIGS. 1-5, the cooling device 624 may be mounted to the enclosure panel 610 by a mounting frame 620 and a pressure layer 622 to provide pressure against the cooling device 624. It should be noted that the structures depicted in FIG. 6 (e.g., the cooling device 624 and cooling plates 626A-B) are illustrative rather than limiting. For example, cooling plates 626A-B may have the same or different dimensions that still provide for redundant cooling plates and cooling channels.

Figure 7:
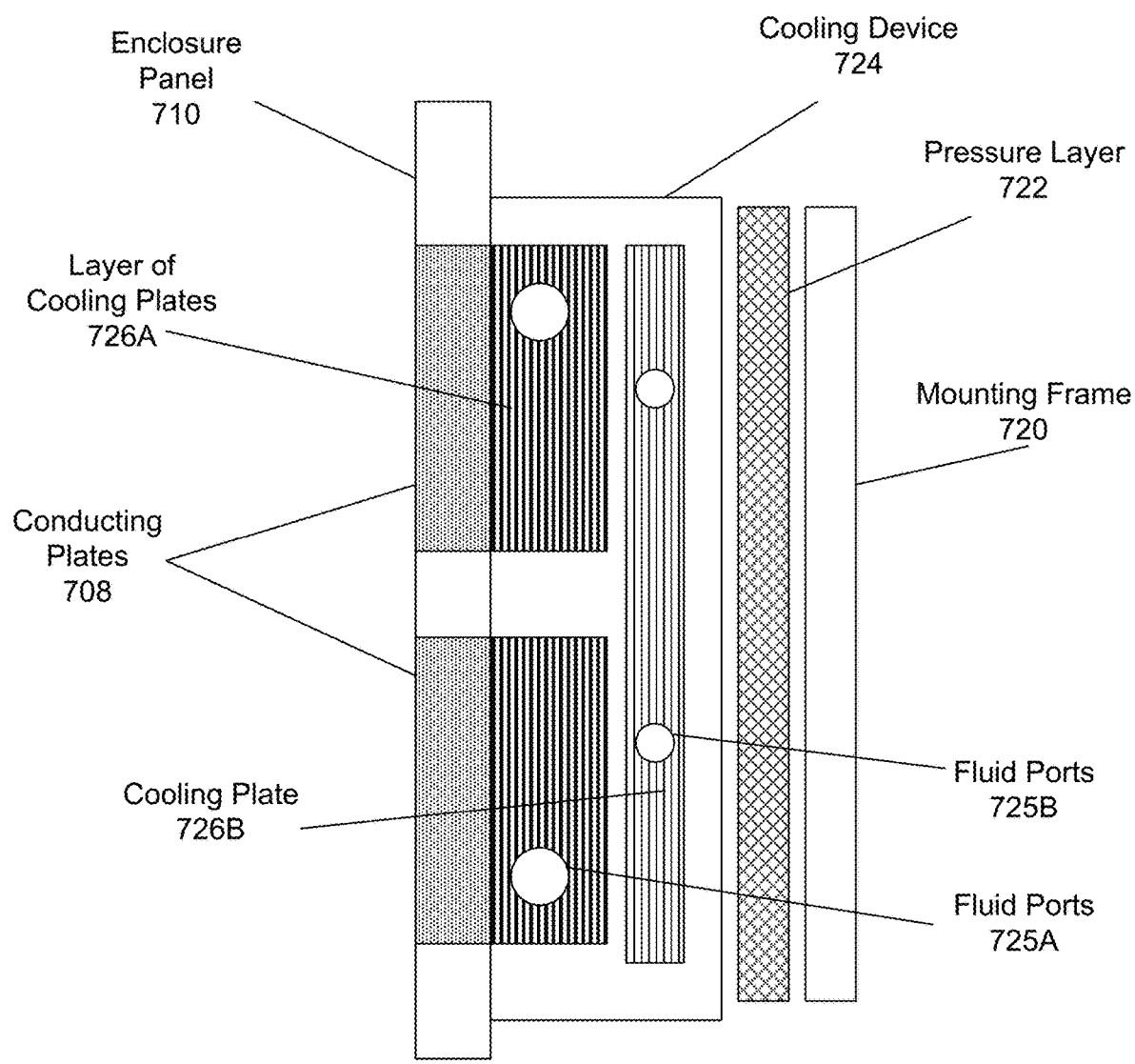
FIG. 7 is rear view of a cooling device with a design corresponding to multiple processors, according to some embodiments.

FIG. 7 shows a cooling device with a design corresponding to multiple processors according to some embodiments. In some embodiments, as depicted in FIG. 7, a cooling device 724 can include a first layer of cooling plates 726A corresponding to multiple electronic devices (e.g., processors) of electronics packaged in an enclosure as described above. The layer of cooling plates may have corresponding fluid ports 725A and fluid channels for providing a cooling liquid to each cooling plate in the layer of cooling plates 726A. The cooling device 724 can include a second cooling plate 726B with separate dedicated fluid ports 725B and fluid channels. The second cooling plate 726B may span the first layer of cooling plates 726A such that the second cooling plate 726B is in thermal contact with the cooling plates of the layer of cooling plates 726A.

The cooling device 724 may operate with the cooling plates of the layer of cooling plates 726A and the second cooling plate 726B at the same time or independently. For example, when cooling very high power density electronic device that generate a large amount of heat, the cooling plate 726B may operate in addition to cooling plate layer 726A to provide additional cooling capacity that may be necessary to cool the electronic device. In another example, if any of the cooling plates of the cooling plate layer 726A fails, then cooling plate 726B may be used to cool the electronic device (e.g., by extracting heat through conducting plates 708 of enclosure panel 710 and cooling plates 726A). Similar to FIGS. 1-5, the cooling device 724 may be mounted to the enclosure panel 710 by a mounting frame 720 and a pressure layer 722 to provide pressure against the cooling device 724. In some embodiments, two or more cooling plates 726A can be connected in series or in parallel.

Figure 8:
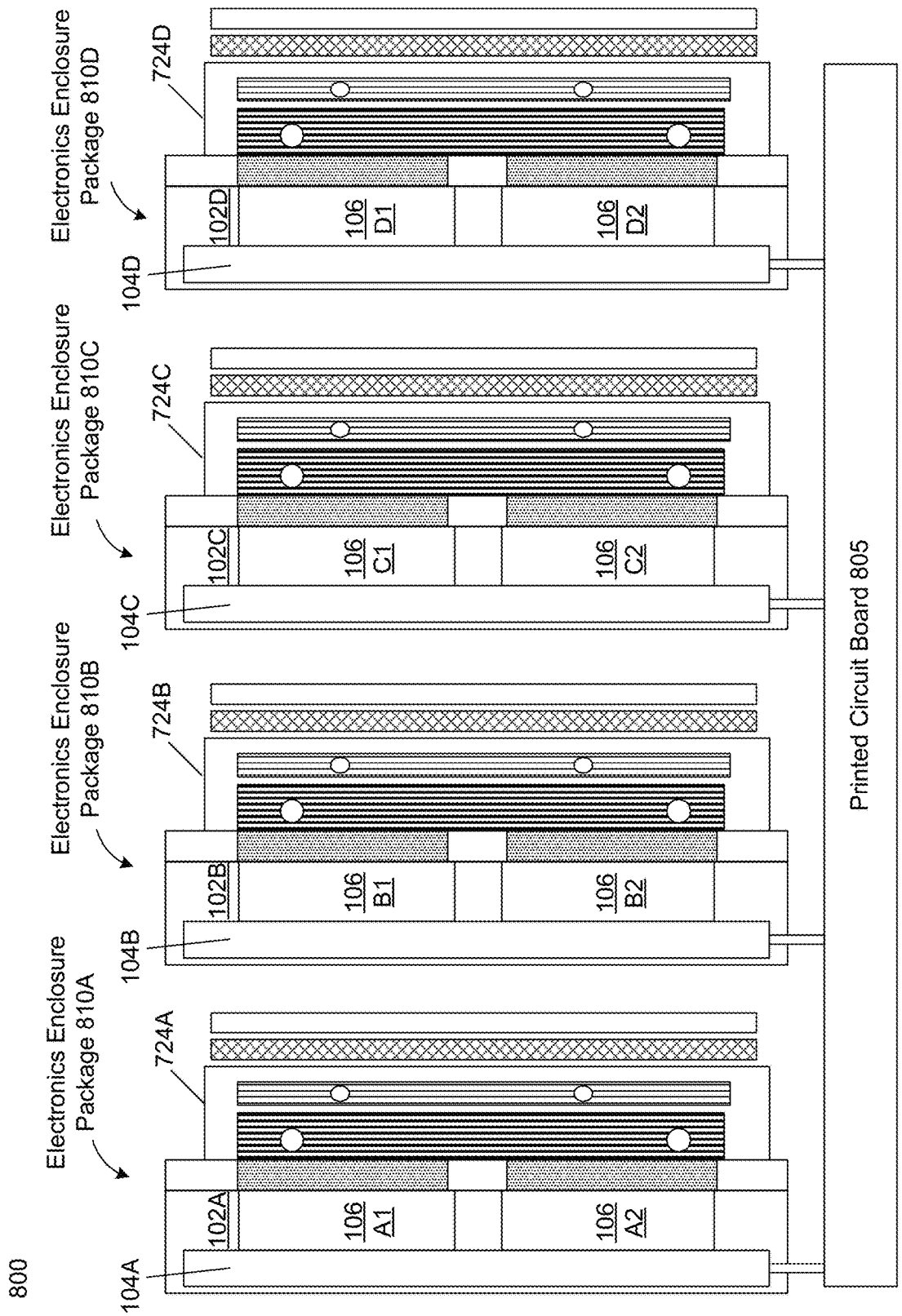
FIG. 8 is a rear view of a server incorporating electronics enclosure packages for liquid cooling of PCIE devices, according to some embodiments.

FIG. 8 shows a rear view of a server 800 incorporating electronics enclosure packages for liquid cooling of PCIE devices, according to some embodiments. As depicted in FIG. 8, multiple electronics enclosure packages (or electronic device cooling packages) 810A-D may be deployed on a server. The server may include a printed circuit board 805 with several PCIE connections/buses. The electronics enclosure packages 810A-D may be connected to the PCB 805 via the PCIE connections/buses 110A-110D or other communicative coupling. Each electronics enclosure package 810A-D may be the same or similar to the electronics enclosure package described above with respect to FIGS. 1-7. For example, electronics enclosure packages 810A can include cooling device 724A attached to enclosure 102A. Enclosure 102A can house PCB 104A with processors 106A1-106A2. Electronics enclosure packages 810B can include cooling device 724B attached to enclosure 102B. Enclosure 102B can house PCB 104B with processors 106B1-106B2. Electronics enclosure packages 810C can include cooling device 724C attached to enclosure 102C. Enclosure 102C can house PCB 104C with processors 106C1-106C2. Electronics enclosure packages 810D can include cooling device 724D attached to enclosure 102D. Enclosure 102D can house PCB 104D with processors 106D1-106D2. Accordingly, the electronic devices (such as processors 106A1-106D2) are included within respective enclosures that segregate them from respective cooling device attached to the surfaces of the enclosures. Each cooling device cools the electronic devices (e.g., processors) through a conducting plate that is integrated into a surface of the enclosure. Although depicted with redundant cooling plates, the cooling device of the electronics enclosure packages 810A-D may include any of the embodiments of the cooling device described herein.

FIG. 9A shows a side view of a server cooling system 900 with a series of cooling devices corresponding to the server depicted in FIG. 9B to be incorporated on the electronics enclosure packages of the server for liquid cooling, according to come embodiments. As depicted in FIG. 9A, several cooling devices 924A-B may be connected in series, or parallel to accommodate multiple rows of electronics devices on a printed circuit board 954 (e.g., a motherboard of a server). For example, cooling device 924A of FIG. 9A may correspond to enclosure 956A of the server 952 depicted in FIG. 9B. Similarly, the cooling device 924B may correspond to enclosure 956B. The cooling devices 924A-B of the server cooling system 900 of FIG. 9A may be mounted to enclosures 956A-B according to embodiments described herein and may be connected by fluid connection lines 910. The cooling device 924B can receive a cooling liquid from an external source via fluid ports 925. The cooling liquid is then provided to the cooling plates 926B via internal fluid channels of the cooling device 924B. The cooling liquid may then flow through fluid connection lines 910 from cooling device 924B to cooling device 924A where internal fluid channels direct the cooling liquid to the cooling plates 926A. The cooling liquid is then returned to the external source through fluid connection lines 910 and cooling device 924B. When the cooling devices 924A-B are mounted on the enclosures 956A-B, the cooling plates 926A align with the conducting plates 958A and the cooling plates 926B align with conducting plates 958B to extract heat from electronics within the enclosures 958A-B according to embodiments described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic device cooling package, comprising:
   an enclosure to house an electronics package, the enclosure comprising at least one panel with an integrated conducting plate exposed to both an inner surface of the at least one panel and an outer surface of the at least one panel; and
   a mounting mechanism attached to the enclosure to detachably couple a cooling device to the outer surface of the at least one panel of the enclosure, wherein the cooling device comprises:
   a first layer of cooling plates corresponding to locations of one or more electronic devices of the electronics package; and
   an additional cooling plate spanning the first layer of cooling plates, wherein the additional cooling plate comprises cooling channels separate from the first layer of cooling plates.

2. The electronic device cooling package of claim 1, wherein the cooling device comprises one or more cooling plates corresponding to a location of one or more electronic devices of the electronics package.

3. The electronic device cooling package of claim 2, wherein the integrated conducting plate is in thermal contact with the one or more electronic devices of the electronics package on the inner surface of the at least one panel and the integrated conducting plate is in thermal contact with the one or more cooling plates of the cooling device on the outer surface of the at least one panel.

4. The electronic device cooling package of claim 2, wherein the mounting mechanism comprises:
   a rigid mounting frame providing an opening between the rigid mounting frame and the enclosure to insert the cooling device.

5. The electronic device cooling package of claim 4, wherein the mounting mechanism further comprises:
a pressure layer disposed within the opening between the rigid mounting frame and the enclosure to provide mounting pressure on the cooling device to fix the cooling device in place and to provide thermal contact between the integrated conducting plate and the one or more cooling plates of the cooling device.

6. The electronic device cooling package of claim 4, wherein the cooling device further comprises:
one or more fully integrated internal fluid channels; and
one or more fluid ports disposed on a back end of the cooling device to provide fluid connections outside of the opening provided by the rigid mounting frame.

7. An electronics cooling system comprising:
a first device cooling package of a first electronics package comprising:
a first enclosure to house the first electronics package, the first enclosure comprising a first panel with a first integrated conducting plate; and
a first mounting mechanism attached to the first enclosure to detachably couple a first cooling device to an outer surface of the first panel of the first enclosure; and
a second device cooling package of a second electronics package comprising:
a second enclosure to house the second electronics package, the second enclosure comprising a second panel with a second integrated conducting plate; and
a second mounting mechanism attached to the second enclosure to detachably couple a second cooling device to an outer surface of the second panel of the second enclosure, wherein the first enclosure is an enclosure different than the second enclosure and the first panel is a panel different than the second panel, wherein the first and second cooling devices each comprise:
a first layer of cooling plates corresponding to locations of one or more electronic devices of the first and second electronics packages; and
an additional cooling plate spanning the first layer of cooling plates, wherein the additional cooling plate comprises cooling channels separate from the first layer of cooling plates.

8. The electronics cooling system of claim 7, wherein the first device cooling package receives a cooling liquid from an external cooling source via one or more fluid ports of the first cooling device.

9. The electronics cooling system of claim 8, wherein the second device cooling package receives the cooling liquid from the first device cooling package via one or more fluid ports of the second cooling device.

10. The electronics cooling system of claim 8, wherein the first and second mounting mechanisms each comprise:
a rigid mounting frame providing an opening between the rigid mounting frame and the first or second enclosure to insert the first or second cooling device.

11. The electronics cooling system of claim 10, wherein the first and second mounting mechanisms each further comprise:
a pressure layer disposed within the opening between the rigid mounting frame and the first and second enclosures to provide mounting pressure on the first and second cooling devices to fix the first and second cooling devices in place and to provide thermal contact between the first and second integrated conducting plates and one or more cooling plates of the first and second cooling devices.

12. The electronics cooling system of claim 10, wherein the first device cooling package comprises:
one or more fully integrated internal fluid channels; and
one or more fluid ports disposed on a back end of the first cooling device to provide fluid connections outside of the opening provided by the rigid mounting frame attached to the first enclosure.

13. A server chassis, comprising:
a plurality of electronics packages; and
a plurality of device cooling packages, each device cooling package being associated with one of the plurality of electronics packages, wherein each device cooling package comprises:
an enclosure to house an electronics package, the enclosure comprising at least one panel with an integrated conducting plate exposed to both an inner surface of the at least one panel and an outer surface of the at least one panel; and
a mounting mechanism attached to the enclosure to detachably couple a cooling device to the outer surface of the at least one panel of the enclosure, wherein the cooling device comprises:
a first layer of cooling plates corresponding to locations of one or more electronic devices of the electronics package; and
an additional cooling plate spanning the first layer of cooling plates, wherein the additional cooling plate comprises cooling channels separate from the first layer of cooling plates.

14. The server chassis of claim 13, wherein the cooling device comprises one or more cooling plates corresponding to a location of one or more electronic devices of the electronics package.

15. The server chassis of claim 14, wherein the integrated conducting plate is in thermal contact with the one or more electronic devices of the electronics package on the inner surface of the at least one panel and the integrated conducting plate is in thermal contact with the one or more cooling plates of the cooling device on the outer surface of the at least one panel.

16. The server chassis of claim 14, wherein the mounting mechanism comprises:
a rigid mounting frame providing an opening between the rigid mounting frame and the enclosure to insert the cooling device.

17. The server chassis of claim 16, wherein the mounting mechanism further comprises:
a pressure layer disposed within the opening between the rigid mounting frame and the enclosure to provide mounting pressure on the cooling device to fix the cooling device in place and to provide thermal contact between the integrated conducting plate and the one or more cooling plates of the cooling device.

18. The server chassis of claim 16, wherein the cooling device comprises:
one or more fully integrated internal fluid channels; and
one or more fluid ports disposed on a back end of the cooling device to provide fluid connections outside of the opening provided by the rigid mounting frame.

* * * * *